US006998701B2

United States Patent
Ochiai et al.

(10) Patent No.: US 6,998,701 B2
(45) Date of Patent: Feb. 14, 2006

(54) RESIN SEALING-TYPE SEMICONDUCTOR DEVICE AND METHOD FOR MANUFACTURING THE SAME

(75) Inventors: Isao Ochiai, Gunma (JP); Masato Take, Saitama (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/793,100

(22) Filed: Mar. 4, 2004

(65) Prior Publication Data

US 2004/0201082 A1   Oct. 14, 2004

(30) Foreign Application Priority Data

Mar. 5, 2003   (JP) .................. P. 2003-059144

(51) Int. Cl.
 *H01L 23/495*   (2006.01)
(52) U.S. Cl. .................. 257/666; 438/15; 438/17; 438/108; 438/118; 257/685; 257/687; 257/783; 257/778
(58) Field of Classification Search .................. 438/15, 438/17, 108, 118; 257/685, 687, 783, 778
See application file for complete search history.

(56) References Cited

U.S. PATENT DOCUMENTS 6,589,802 B1 * 7/2003 Asada et al. .................. 438/15
6,627,997 B1 * 9/2003 Eguchi et al. .............. 257/777

* cited by examiner

Primary Examiner—Mai-Huong Tran
(74) Attorney, Agent, or Firm—Fish & Richardson P.C.

(57) ABSTRACT

A resin sealing-type semiconductor device comprises a first semiconductor chip 15 with a large amount of heat generation, whose external electrode leading-out bonding pads 16 are wire-bonded to respective outer leads 25A and a second semiconductor chip 17 smaller in the amount of heat generation than the first semiconductor chip, whose external electrode leading-out bonding pads 18 are wire-bonded to respective outer leads 25A, wherein the first semiconductor chip 15 is molded by a high thermal conductive resin 28, and the second semiconductor chip 17 and the first semiconductor chip 15 molded by the high thermal conductive resin are integrally molded by a non-high thermal conductive resin 31. A method includes manufacturing the resin sealing-type semiconductor device.

5 Claims, 8 Drawing Sheets

FIG.3A — First semiconductor chip

FIG.3B — Die bonding

FIG.3C — Wire bonding

FIG.3D — Transfer molding by High thermal conductive resin

FIG.3E — Second semiconductor chip

FIG.3F — Die bonding

FIG.3G — Wire bonding

FIG.3H — Transfer molding by Non-high thermal conductive resin

FIG.3I — Plating

FIG.3J — Printing

FIG.4

| Resin type | | Non-high thermal conductive resin | Non-high thermal conductive resin + High thermal conductive resin | High thermal conductive resin | |
|---|---|---|---|---|---|
| Filler blend | Fused silica | 100% | 20% | — | |
| | Crystal silica | — | 80% | — | |
| | Alumina | — | — | 100% | |
| Filler amount | | 73 | 75 | 89 | wt% |
| Thermal conductivity | | 0.63 | 1.47 | 4.5 | w/m·K |
| Low-stress agent | | Silicon base | Silicon base | — | — |

RESIN SEALING-TYPE SEMICONDUCTOR DEVICE AND METHOD FOR MANUFACTURING THE SAME

BACKGROUND OF THE INVENTION

1. Field of the Invention

This invention relates to a resin sealing-type semiconductor device wherein a semiconductor chip with a large amount of heat generation formed by bipolar transistors and an LSI chip with a small amount of heat generation such as a microcomputer formed by MOS transistors are resin-molded in an identical package and a method for manufacturing the same.

2. Description of the Related Art

In a semiconductor device used in a TV receiver, a semiconductor chip forming a power amplifying circuit to amplify a received signal and an LSI chip forming a microcomputer for various types of control of this electrical power amplifying circuit are integrally molded by an identical resin.

In addition, in a motor, an electric power semiconductor chip to supply an electric current to a coil and a controlling semiconductor chip formed by MOSFETs, to control the electric power semiconductor chip are integrally molded by an identical resin. A complex resin sealing-type semiconductor device wherein an electric power semiconductor chip and a controlling semiconductor chip are integrally resin-molded as such has been used in many cases.

FIG. 7 and FIG. 8 are a sectional view and a plan view of a related-art complex resin sealing-type semiconductor device. A semiconductor chip 1 to form a power amplifying circuit, etc., is composed of bipolar-type transistors. These semiconductor chips 1 are bonded to die pad portions 2A of a lead frame 2, and external electrode lead-out bonding pads 3 of the semiconductor chip 1 are wire-bonded to outer leads 5 of the lead frame 2 via thin metal wires 6.

Similarly, an LSI chip 7 to form a microcomputer is formed of MOSFETs. These LSI chips 7 are bonded to die pad portions 2B of the lead frame 2, and external electrode lead-out bonding pads 9 of the LSI chip 7 are wire-bonded to outer leads 5 of the lead frame 2 via thin metal wires 10. The semiconductor chip 1 and IC chip 7 attached to the lead frame 2 are placed in a molding die except for the outer leads 5 which are respectively wire-bonded, and are transfer-molded by injecting a molding resin 11 into the molding die.

In a related-art resin sealing-type semiconductor device, an integrated circuit chip composed of bipolar-type transistors forming a power amplifying circuit to amplify a signal and an integrated circuit chip composed of MOS-type transistors have been integrally molded by an identical resin.

Herein, since a semiconductor chip forming a power amplifying circuit has a large amount of heat generation, it is necessary to release the generated heat by transmitting the same by use of a resin with an excellent thermal conductivity. However, this is costly since a high thermal conductive resin is more expensive than a non-high thermal conductive resin generally used for resin sealing.

In addition, alumina is blended in a resin to obtain a high thermal conductive resin. In this case, since the high thermal conductive resin becomes great in stress compared to a generally used low-stress resin, this causes a distortion in a semiconductor chip to be molded.

SUMMARY OF THE INVENTION

The preferred embodiment of this invention realizes a resin sealing-type semiconductor device which produces no effect even when a first semiconductor chip with a large amount of heat generation and a second semiconductor chip smaller in the amount of heat generation than the first semiconductor chip are integrally sealed and a manufacturing method thereof, and a resin sealing-type semiconductor device comprises: a lead frame including a first die pad portion, a second die pad portion, and outer leads provided in a manner corresponding to the respective die pad portions; a first semiconductor chip with a large amount of heat generation, which is die-bonded to the first die pad portion and whose external electrode leading-out bonding pads and the outer leads corresponding thereto are wire-bonded; and a second semiconductor chip smaller in the amount of heat generation than the first semiconductor chip, which is die-bonded to the second die pad portion and whose external electrode leading-out bonding pads and the outer leads corresponding thereto are wire-bonded, wherein the first semiconductor chip is resin-sealed by a high thermal conductive resin, and the second semiconductor chip and the first semiconductor chip resin-sealed by the high thermal conductive resin are integrally resin-sealed by a non-high thermal conductive resin.

In addition, a method for manufacturing a resin sealing-type semiconductor device of the preferred embodiment of this invention comprises the steps of: preparing a lead frame including a first die pad portion, a second die pad portion, and outer leads provided in a manner corresponding to the respective die pad portions; die-bonding a first semiconductor chip with a large amount of heat generation to the first die pad portion, wire-bonding external electrode leading-out bonding pads of the first semiconductor chip and the outer leads corresponding thereto; transfer-molding the first semiconductor chip by a high thermal conductive resin; die-bonding a second semiconductor chip smaller in the amount of heat generation than the first semiconductor chip to the second die pad portion, wire-bonding external electrode leading-out bonding pads of the second semiconductor chip and the outer leads corresponding thereto; and integrally molding, by a non-high thermal conductive resin, the second semiconductor chip including the first semiconductor chip molded by the high thermal conductive resin.

Moreover, a method for manufacturing a resin sealing-type semiconductor device of the preferred embodiment of this invention comprises the steps of: preparing a lead frame including a first die pad portion, a second die pad portion, and outer leads provided in a manner corresponding to the respective die pad portions; die-bonding a first semiconductor chip with a large amount of heat generation to the first die pad portion, wire-bonding external electrode leading-out bonding pads of the first semiconductor chip and the outer leads corresponding thereto; molding the first semiconductor chip by potting with a high thermal conductive resin; die-bonding a second semiconductor chip smaller in the amount of heat generation than the first semiconductor chip to the second die pad portion, wire-bonding external electrode leading-out bonding pads of the second semiconductor chip and the outer leads corresponding thereto; and integrally molding, by a non-high thermal conductive resin, the second semiconductor chip including the first semiconductor chip molded by the high thermal conductive resin.

In a resin-sealing type semiconductor device of the preferred embodiment of this invention, the die pad portions, to which the first semiconductor chip and second semiconductor chip are attached, are constructed so as to have a low thermal conductivity, and the first semiconductor chip with a large amount of heat generation is sealed by a high thermal conductive resin, therefore, heat generated from the first semiconductor chip is swiftly released to the outside. Accordingly, transmission of the heat generated in the first semiconductor chip to the second semiconductor chip attached to the second die pad is prevented.

In addition, since the second semiconductor chip with a small amount of heat generation is molded by a non-high thermal conductive resin, although the high thermal conductive resin is more expensive than the non-high thermal conductive resin, since the first semiconductor chip is only resin-sealed by the high thermal conductive resin, the amount of use is slight and an increase in costs as a whole is slight.

Furthermore, although the high thermal conductive resin has a great distortion stress, the second semiconductor chip composed of MOS-type transistors easily affected by a stress is molded by a resin which has a low stress despite a low thermal conductivity, therefore, a stress to be applied is small and fluctuation in the circuit characteristics or malfunction can be prevented.

BRIEF DESCRIPTION OF THE DRAWINGS

FIG. 3 is a view showing a method for manufacturing a resin sealing-type semiconductor device of this embodiment, wherein FIG. 3A to FIG. 3J are a flowchart showing manufacturing steps;

FIG. 4 is a table showing components and characteristics, etc., of resins used in the resin sealing-type semiconductor devices and manufacturing methods of the same according to this embodiment and related art;

FIG. 6 is a view showing a method for manufacturing a resin sealing-type semiconductor device of still another embodiment, wherein FIG. 6A to FIG. 6(I) are a flowchart showing manufacturing steps;

DETAILED DESCRIPTION OF THE EMBODIMENTS

A resin sealing-type semiconductor device and a manufacturing method thereof of this embodiment will be described according to FIG. 1 to FIG. 6.

Figure 1:
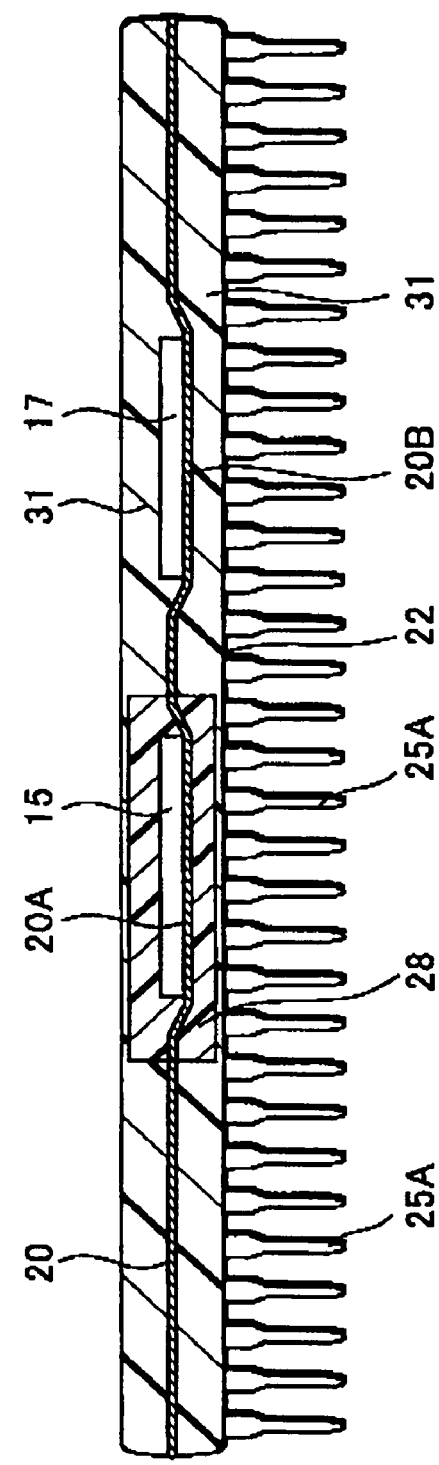
FIG. 1 is a sectional view showing a resin sealing-type semiconductor device of this embodiment.
Figure 2:
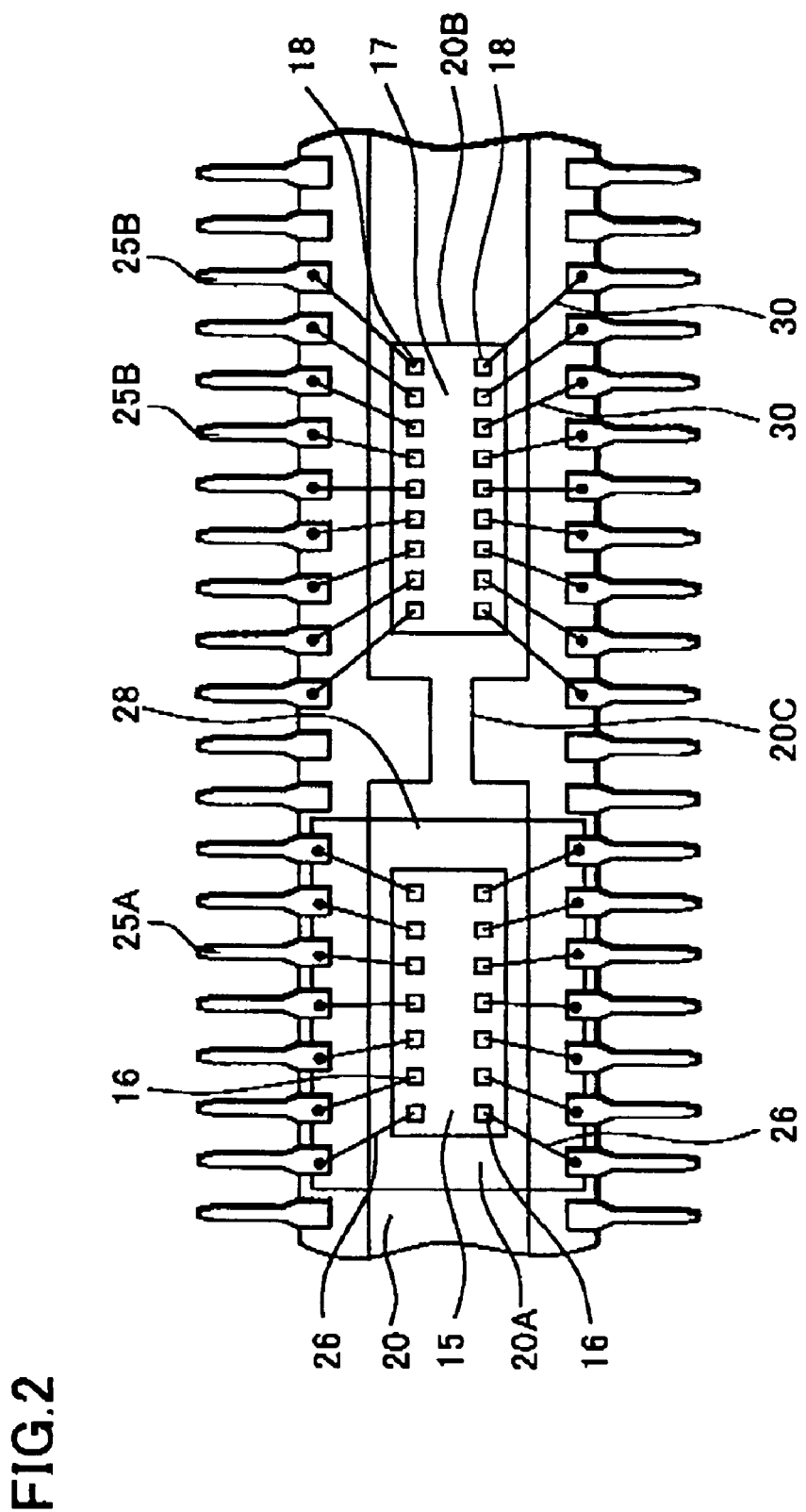
FIG. 2 is a plan view showing a resin sealing-type semiconductor device of this embodiment.

FIG. 1 is a sectional view showing a resin sealing-type semiconductor device of this embodiment, FIG. 2 is a plan view of, similarly, a resin sealing-type semiconductor device of this embodiment and a main part of a resin sealing-type semiconductor device of this embodiment. A first semiconductor chip 15 is a power amplifying circuit used in a TV receiver, composed of bipolar-type transistors or an electric power integrated circuit such as a motor circuit to supply a current to a motor coil composed of bipolar-type transistors, and since power consumption is great, heat generation is great. On the first semiconductor chip 15, multiple external electrode lead-out bonding pads 16, 16 . . . are provided.

A second semiconductor chip 17 is an LSI composed of MOS-type transistors used for various types of control such as channel control of a TV receiver, and in actuality, a microcomputer is used therefor, and multiple external electrode lead-out bonding pads 18 are provided in the second semiconductor chip 17, as well. The second semiconductor chip 17 is smaller in the amount of heat generation than the first semiconductor chip 15, and is higher in sensibility to a resin stress and is easily influenced by distortion and heat.

In addition, the first semiconductor chip 15 is die-bonded to a first die pad portion 20A of a lead frame 20, and the second semiconductor chip 17 is die-bonded to a second die pad portion 20B of a lead frame 20, and these are encapsulated in a resin package 22.

Although the first die pad portion 20A and second die pad portion 20B may be provided in separate lead frames, if these are provided in the identical lead frame 20, a narrowed tie bar 20C is formed to lower thermal conduction.

The respective bonding pads 16 of the first semiconductor chip 15 are wire-bonded to corresponding outer leads 25A provided on the lead frame 20 by thin metal wires 26. Similarly, the respective bonding pads 18 of the second semiconductor chip 17 are wire-bonded to corresponding outer leads 25B provided on the lead frame 20 by thin metal wires 30.

After the first semiconductor chip 15 and second semiconductor chip 17 attached to the lead frame 20 are, after the respective bonding pads 16 and 18 are wire-bonded to the outer leads 25A, 25B, sealed and integrated by a resin in a manner where the outer leads 25A, 25B are protruded to the outside.

However, since the first semiconductor chip 15 has a large amount of heat generation and reaches a high temperature, it is necessary to swiftly transfer and release the generated heat to the outside so as not to be transmitted elsewhere. In contrast thereto, since the second semiconductor chip 17 has a small amount of heat generation, this does not reach a very high temperature. In addition, the second semiconductor chip 17 is easily affected by stress. Meanwhile, a high thermal conductive resin is more expensive and has a greater resin stress than a non-high thermal conductive resin.

Therefore, in this embodiment, the first semiconductor chip 15 of only that part is molded by an expensive high thermal conductive resin 28 so that generated heat is swiftly released to the outside.

And, the first semiconductor chip 15 resin-sealed by the high thermal conductive resin 28 and the second semiconductor chip 17 are integrally resin-sealed by a generally used inexpensive and low-stress non-high thermal conductive resin 31.

FIG. 3 is a flowchart showing manufacturing steps of integrally resin-molding the first semiconductor chip 15 and second semiconductor chip 17 by a resin.

As shown in FIG. 3A, first, the first semiconductor chip 15 with a large amount of heat generation composed of bipolar transistors is prepared.

As shown in FIG. 3B, the first semiconductor chip 15 is die-bonded to the first die pad portion 20A of the lead frame 20.

Thereafter, as shown in FIG. 3C, the respective bonding pads 16 of the first semiconductor chip and the outer leads 25A are wire-bonded by the thin metal wires 26.

Then, as shown in FIG. 3D, only the first semiconductor chip 15 attached to the lead frame 20 except for the outer leads 25A is installed inside a cavity formed by a metal die, and the high thermal conductive resin 28 is injected into the cavity to resin-seal the first semiconductor chip 15.

Next, as shown in FIG. 3E, after the first semiconductor chip 15 is resin-sealed, the second semiconductor chip 17 composed of MOSFETs, which is smaller in the amount of heat generation than the first semiconductor chip, is prepared.

As shown in FIG. 3F, the second semiconductor chip 17 is die-bonded to a second die pad portion 20B of the lead frame 20.

Thereafter, as shown in FIG. 3G, similarly to the foregoing, the respective bonding pads 18 and the outer leads 25B are die-bonded by the thin metal wires 30.

Furthermore, as shown in FIG. 3H, the first semiconductor chip 15 transfer-molded by the high thermal resin 28 and the second semiconductor chip 17 are integrally transfer-molded by the non-high thermal conductive resin 31.

In the transfer molding step, the first semiconductor chip 15 attached to the first die pad portion 20A of the lead frame 20 and resin-sealed by the high thermal conductive resin 28 and the second semiconductor chip 17 attached to the second die pad portion 20B of the lead frame 20 are installed in a cavity formed by a metal die composed of upper and lower parts. Thereafter, the non-high thermal conductive resin 31 is injected inside the cavity to resin-seal the first and second semiconductor chips 15 and 17.

As shown in FIG. 3I, after the first semiconductor chip 15 and second semiconductor chip 17 are integrally transfer-molded by the non-high thermal conductive resin 31, the outer leads 25 part protruded to the outside from the molded non-high thermal conductive resin 31 is plated.

As shown in FIG. 3J, a semiconductor device is completed by lastly printing on the surface a model name and a serial number, etc.

FIG. 4 is a table showing components and characteristics, etc., of various resins used in the above-described transfer molding. As shown in the table, the high thermal conductive resin 28 which has molded the first semiconductor chip has a filler blend of alumina 100%. Thermal conductivity thereof is 4.5 W/m·K, which is greater than 0.63 W/m·K of the generally used non-high thermal conductive resin 31.

Since the high thermal conductive resin 28 is markedly great in the thermal conductivity as such, heat generated in the first semiconductor chip 15 is swiftly released to the outside through the high thermal conductive resin 28. Accordingly, overheating of the first semiconductor chip 15 is prevented.

As such, since the heat generated in the first semiconductor chip 15 is swiftly released to the outside by the high-thermal conductive resin 28, no heat is transmitted even when the second semiconductor chip 17 is integrally resin-sealed. In addition, the second semiconductor chip 17 is small in the amount of heat generation, the second semiconductor chip 17 is not overheated by itself as a result of heat generation.

The high thermal conductive resin 28 is approximately three times or more as expensive as the non-high thermal conductive resin 31, and if the whole is molded with the high thermal conductive resin 28, the price of a semiconductor device rises. However, since only the first semiconductor chip 15 is molded with the high thermal conductive resin 28, the amount of use can be held down, and a rise in the price is slight.

Herein, a mixture of the high thermal conductive resin and non-high thermal conductive resin shown in the center of the table of FIG. 4 is superior in the thermal conductivity to the conventional non-high thermal conductive resin; nevertheless the thermal conductivity is insufficient to swiftly release heat generated in the first semiconductor chip 15.

In addition, the non-high thermal conductive resin results in, since this is a silicon-based resin, a low-stress resin compared to the high thermal conductive resin with alumina mixed. Accordingly, the resin stress when the non-high thermal conductive resin is molded on the second semiconductor chip 17 is low, whereby fluctuation in the circuit characteristics of the second semiconductor chip and malfunction are prevented.

Figure 5:
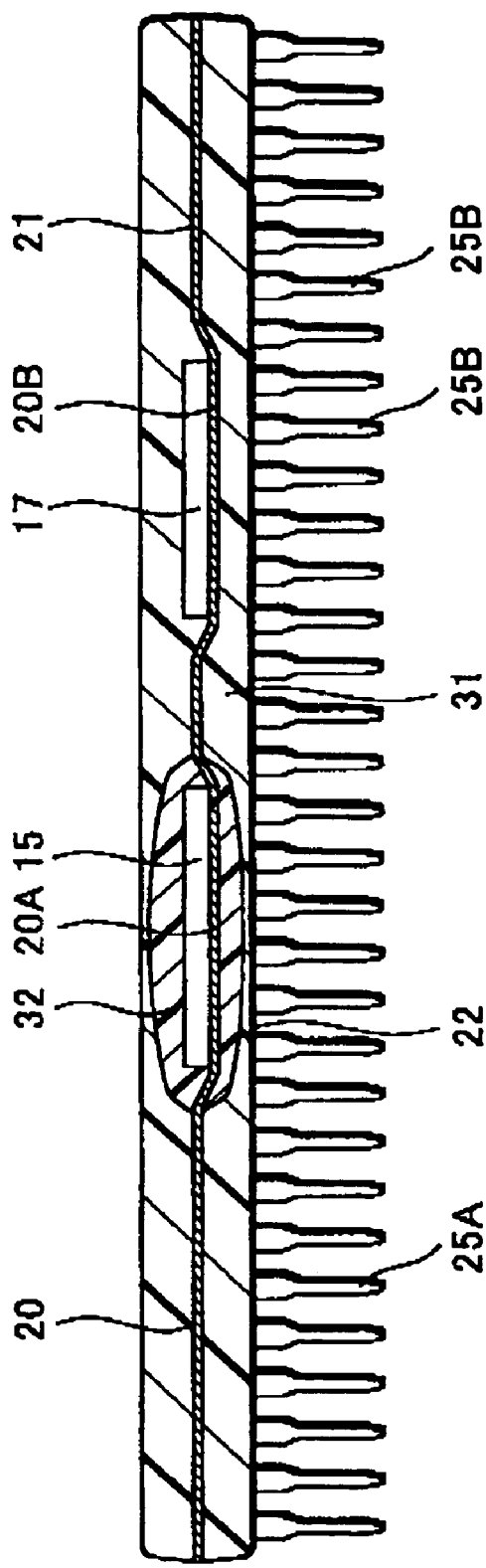
FIG. 5 is a sectional view showing a resin sealing-type semiconductor device of another embodiment.

FIG. 5 is a sectional view showing another embodiment of a resin sealing-type semiconductor device and a method for manufacturing the same. Similar to the foregoing, the first semiconductor chip 15 is composed of bipolar transistors, on which multiple bonding pads 16 are provided. Moreover, the second semiconductor 17 is a microcomputer, on which multiple bonding pads 18 are provided.

The first semiconductor chip 15 is die-bonded to the first die pad portion 20A of the lead frame 20, and the second semiconductor chip 17 is die-bonded to the second die pad portion 20B of the lead frame 20, and these are encapsulated in the resin package 22. The first semiconductor chip 15 and second semiconductor chip 17 are sealed and integrated by a resin after being attached to the lead frame 20.

And, since the first semiconductor chip 15 has a large amount of heat generation, it is necessary to swiftly transfer and release the generated heat to the outside. On the other hand, since the second semiconductor chip 17 has a small amount of heat generation, it is unnecessary to increase so much heat release.

Therefore, similar to the foregoing, the first semiconductor chip 15 of only that part is resin-molded by potting a high thermal conductive resin 32 so that generated heat is swiftly released to the outside. Furthermore, the first semiconductor chip 15 resin-sealed by the high thermal conductive resin 32 and the second semiconductor chip 17 are integrally resin-sealed by the generally used non-high thermal conductive resin 31, which is identical to the semiconductor device shown in FIG. 1.

However, in the semiconductor device shown in FIG. 5, in place of the transfer molding by the high thermal conductive resin 32, the first semiconductor chip 15 is resin-sealed by potting of the high thermal conductive resin 32.

Figure 6:
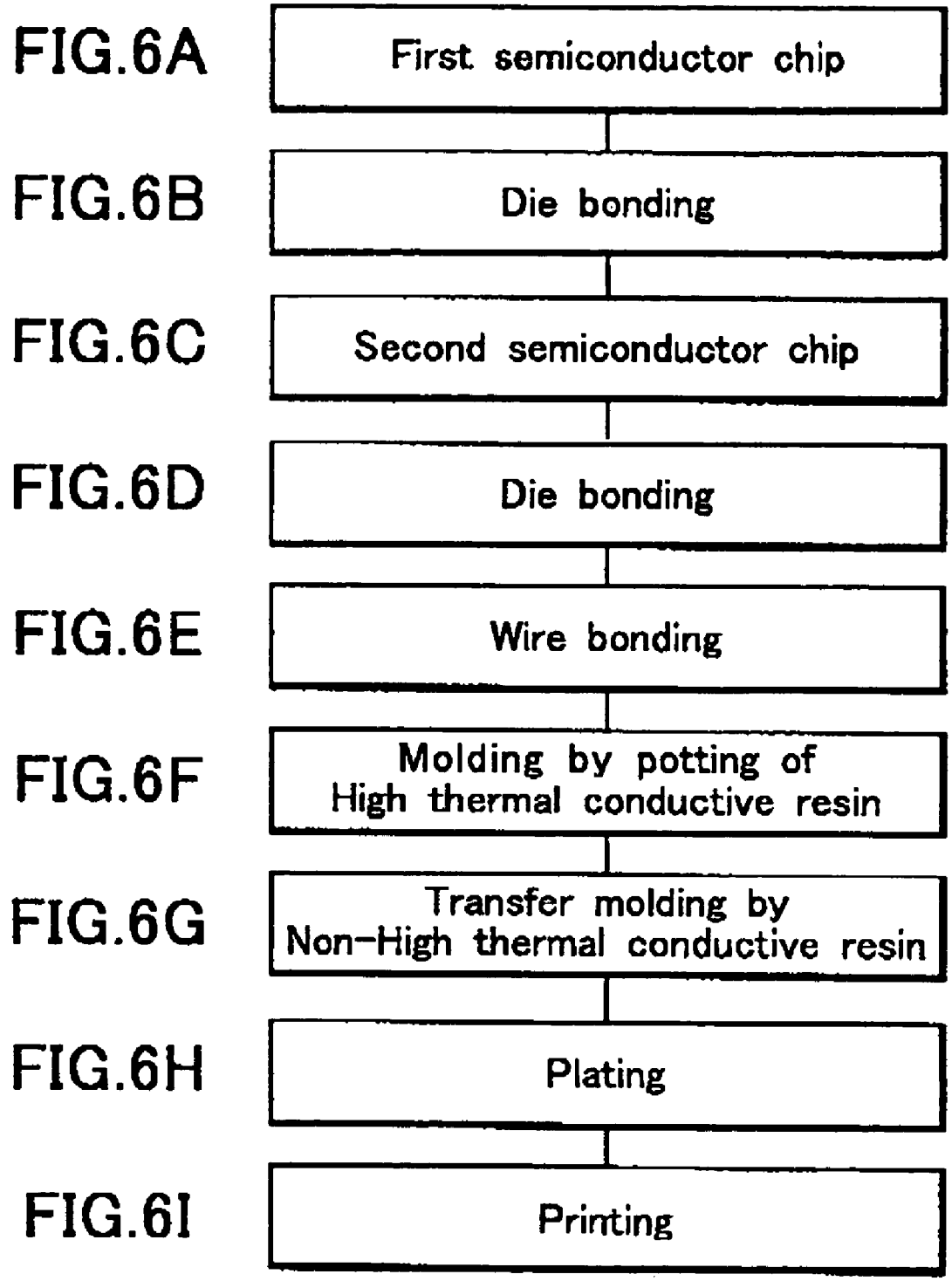
Figure 7:
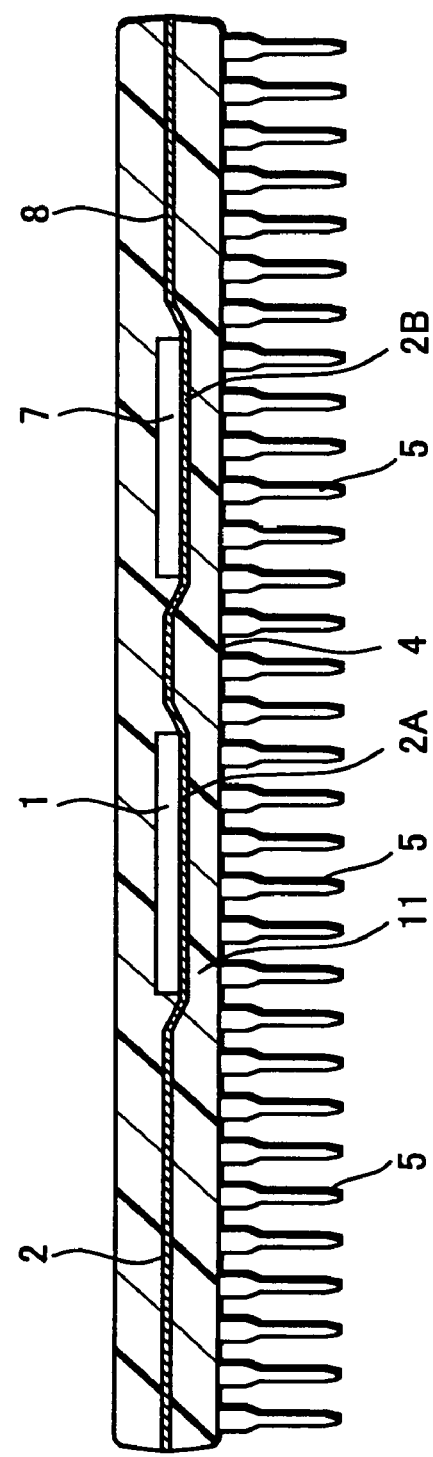
FIG. 7 is a sectional view showing a related-art resin sealing-type semiconductor device.
Figure 8:
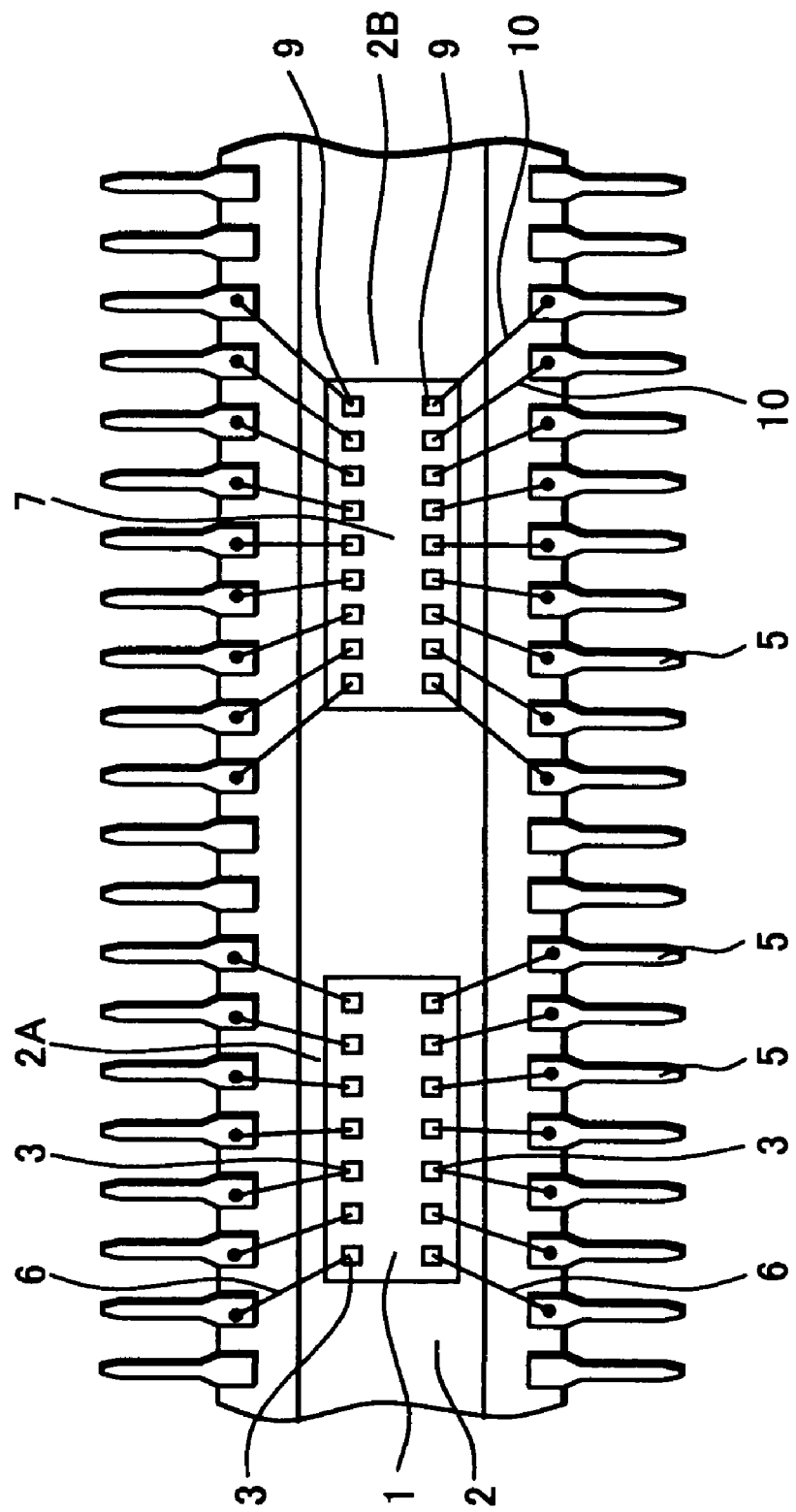
FIG. 8 is a plan view showing a related-art resin sealing-type semiconductor device.

FIG. 6 is a flowchart showing manufacturing steps of the semiconductor device of FIG. 5.

As shown in FIG. 6A, first, the first semiconductor chip 15 with a large amount of heat generation composed of bipolar transistors is prepared.

As shown in FIG. 6B, first, similar to the foregoing, the first semiconductor chip 15 with a large amount of heat generation composed of bipolar transistors is die-bonded to the first die pad portion 20A of the lead frame 20.

Next, as shown in FIG. 6C, the second semiconductor chip 17 composed of MOS-type transistors, which is small in the amount of heat generation, is prepared.

As shown in FIG. 6D, the second semiconductor chip 17 composed of MOSFETs with a small amount of heat generation is also die-bonded to the second die pad 20B.

As shown in FIG. 6E, thereafter, the respective bonding pads 16 of the first semiconductor chip 15 and the outer leads 25A are wire-bonded by the thin metal wires 26. Simultaneously therewith, the respective bonding pads 18 of the second semiconductor chip 17 and the outer leads 25B, which are different from the foregoing, are wire-bonded by the thin metal wires 30.

As shown in FIG. 6F, only the part of the wire-bonded first semiconductor chip 17 is molded by potting with drops of the generally high thermal conductive resin 32.

As shown in FIG. 6G, the first semiconductor chip 15 molded by potting with the high thermal resin 32 and the second semiconductor chip 17 are integrally transfer-molded by the generally used non-high thermal conductive resin 31.

In the transfer molding step, the first semiconductor chip 15 attached to the first die pad portion 20A of the lead frame 20 and resin-sealed by the high thermal conductive resin 28 and the second semiconductor chip 17 attached to the second die pad portion 20B of the lead frame 20 are installed in a cavity formed by the metal die composed of upper and lower parts. Thereafter, the non-high thermal conductive resin 31 is injected inside the cavity to resin-seal the first and second semiconductor chips 15 and 17.

As shown in FIG. 6H, after the first semiconductor chip 15 and second semiconductor chip 17 are integrally transfer-molded by the non-high thermal conductive resin 31, the outer leads 25 part protruded to the outside from the molded non-high thermal conductive resin 31 is plated.

As shown in FIG. 6I, the semiconductor device is completed by lastly printing on the surface a model name and a serial number, etc.

What is claimed is:

1. A resin sealing-type semiconductor device comprising:
   a lead frame including a first die pad portion, a second die pad portion, and outer leads provided in a manner corresponding to the first and second die pad portions;
   a first semiconductor chip with a large amount of heat generation, which is die-bonded to the first die pad portion and whose external electrode leading-out bonding pads and the outer leads corresponding thereto are wire-bonded; and
   a second semiconductor chip smaller in the amount of heat generation than the first semiconductor chip, which is die-bonded to the second die pad portion and whose external electrode leading-out bonding pads and the outer leads corresponding thereto are wire-bonded, wherein
   the first semiconductor chip is resin-sealed by a high thermal conductive resin, and the second semiconductor chip and the first semiconductor chip resin-sealed by the high thermal conductive resin are integrally resin-sealed by a non-high thermal conductive resin.

2. The resin sealing-type semiconductor device of claim 1, wherein
   the first semiconductor chip is of bipolar transistors for electric power, and the second semiconductor chip is an integrated circuit composed of MOS transistors.

3. The resin sealing-type semiconductor device of claim 1, wherein
   the non-high thermal conductive resin is composed of a low-stress resin.

4. A manufacturing method of a resin sealing-type semiconductor device comprising:
   preparing a lead frame including a first die pad portion, a second die pad portion, and outer leads provided in a manner corresponding to the first and second die pad portions;
   die-bonding a first semiconductor chip with a large amount of heat generation to the first die pad portion, wire-bonding external electrode leading-out bonding pads of the first semiconductor chip and the outer leads corresponding thereto;
   transfer-molding the first semiconductor chip by a high thermal conductive resin;
   die-bonding a second semiconductor chip smaller in the amount of heat generation than the first semiconductor chip to the second die pad portion, wire-bonding external electrode leading-out bonding pads of the second semiconductor chip and the outer leads corresponding thereto; and
   integrally molding, by a non-high thermal conductive resin, the second semiconductor chip including the first semiconductor chip molded by the high thermal conductive resin.

5. A manufacturing method of a resin sealing-type semiconductor device comprising:
   preparing a lead frame including a first die pad portion, a second die pad portion, and outer leads provided in a manner corresponding to the first and second die pad portions;
   die-bonding a first semiconductor chip with a large amount of heat generation to the first die pad portion, wire-bonding external electrode leading-out bonding pads of the first semiconductor chip and the outer leads corresponding thereto;
   molding the first semiconductor chip by potting with a high thermal conductive resin;
   die-bonding a second semiconductor chip smaller in the amount of heat generation than the first semiconductor chip to the second die pad portion, wire-bonding external electrode leading-out bonding pads of the second semiconductor chip and the outer leads corresponding thereto; and
   integrally molding, by a non-high thermal conductive resin, the second semiconductor chip including the first semiconductor chip molded by the high thermal conductive resin.

* * * * *